(12) United States Patent
Kim

(10) Patent No.: US 6,955,958 B2
(45) Date of Patent: Oct. 18, 2005

(54) METHOD OF MANUFACTURING A SEMICONDUCTOR DEVICE

(75) Inventor: Hag Dong Kim, Suwon-si (KR)

(73) Assignee: DongbuAnam Semiconductor, Inc., Seoul (KR)

( * ) Notice: Subject to any disclaimer, the term of this patent is extended or adjusted under 35 U.S.C. 154(b) by 103 days.

(21) Appl. No.: 10/743,180

(22) Filed: Dec. 23, 2003

(65) Prior Publication Data

US 2004/0147071 A1 Jul. 29, 2004

(30) Foreign Application Priority Data

Dec. 30, 2002  (KR) ................................ 10-2002-0087489
Dec. 30, 2002  (KR) ................................ 10-2002-0087487

(51) Int. Cl.[7] ......................................... H01L 21/8238
(52) U.S. Cl. ....................................... 438/231; 438/923
(58) Field of Search ............................... 438/224, 230, 438/231, 232, 529, 923

(56) References Cited

U.S. PATENT DOCUMENTS

| | | | |
|---|---|---|---|
| 4,745,086 A | | 5/1988 | Parrillo et al. |
| 4,843,023 A | * | 6/1989 | Chiu et al. .................... 438/231 |
| 5,166,087 A | * | 11/1992 | Kakimoto et al. ........... 438/302 |
| 5,234,850 A | * | 8/1993 | Liao ............................ 438/231 |
| 5,254,866 A | | 10/1993 | Ogoh |
| 5,460,993 A | | 10/1995 | Hsu et al. |
| 6,107,130 A | | 8/2000 | Fulford, Jr. et al. |

* cited by examiner

Primary Examiner—Chandra Chaudhari
(74) Attorney, Agent, or Firm—Pillsbury Winthrop Shaw Pittman LLP (57) ABSTRACT

A method of manufacturing a semiconductor device is disclosed. An oxide layer for regulating ion-implantation is formed before the implantation of the impurities into a predetermined region of a P-lightly doped drained (LDD) to regulate the implantation state of P type impurities into the corresponding predetermined region of P-LDD based on the oxide layer for regulating the ion-implantation so that the PMOS side predetermined channel length is elongated longer that the NMOS side predetermined channel length. A method of manufacturing a semiconductor device is also disclosed, wherein separate spacers are selected and formed on a different scales before the implantation of the impurities into predetermined regions of P-LDD and an N-LDD to regulate the implantation state of impurities into the respective predetermined regions of the LDD based on the differently scaled spacers so that the PMOS and NMOS side predetermined channel lengths are selectively regulated.

7 Claims, 11 Drawing Sheets

METHOD OF MANUFACTURING A SEMICONDUCTOR DEVICE

CROSS-REFERENCE TO RELATED APPLICATION

The entire disclosure of Korean Patent Applications Nos. 10-2002-0087487 and 10-2002-0087489 filed on Dec. 30, 2002 including specification, claims, drawings and summary are incorporated herein by reference in its entirety.

BACKGROUND OF THE INVENTION

1. Field of the Invention

The present invention relates to a method of manufacturing a semiconductor device, and more particularly to a method of manufacturing a semiconductor device, wherein an oxide layer for regulating the ion-implantation is previously formed or separate spacers are selected and formed on different scales before the implantation of the impurities into a predetermined region of a P-lightly doped drain (LDD), to optionally regulate the implantation state of impurities implanted into the predetermined region of the LDD. Accordingly, if necessary, the PMOS and NMOS side predetermined channel lengths are selectively regulated, naturally maintaining the finished PMOS and NMOS side channel lengths equal irrespective of diffusion velocity of the respective impurities even if a substantial annealing process is performed and a P type impurity is diffused faster than an N type impurity.

2. Description of the Prior Art

Figure 1:
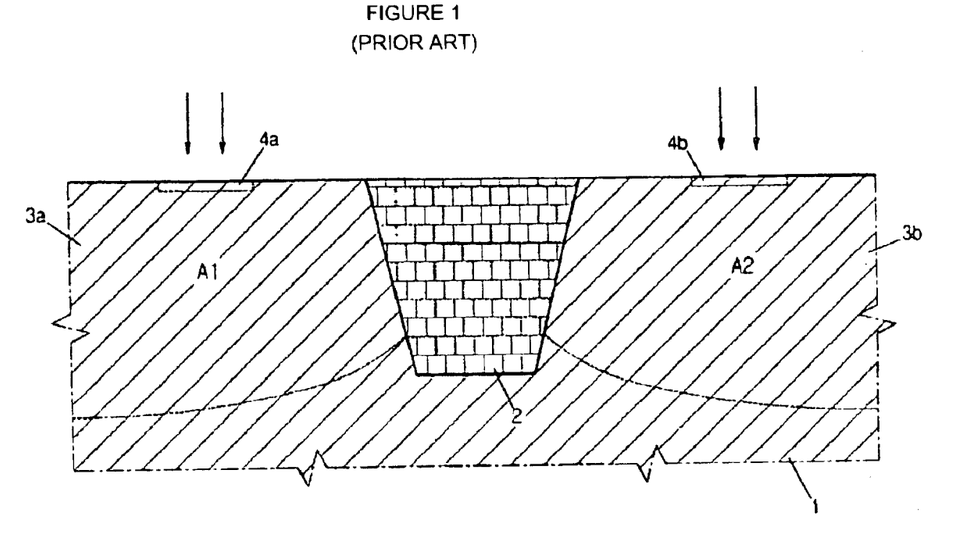
FIGS. 1 to 4 are cross sectional process end views showing a method of manufacturing a semiconductor device according to the prior art.
Figure 2:
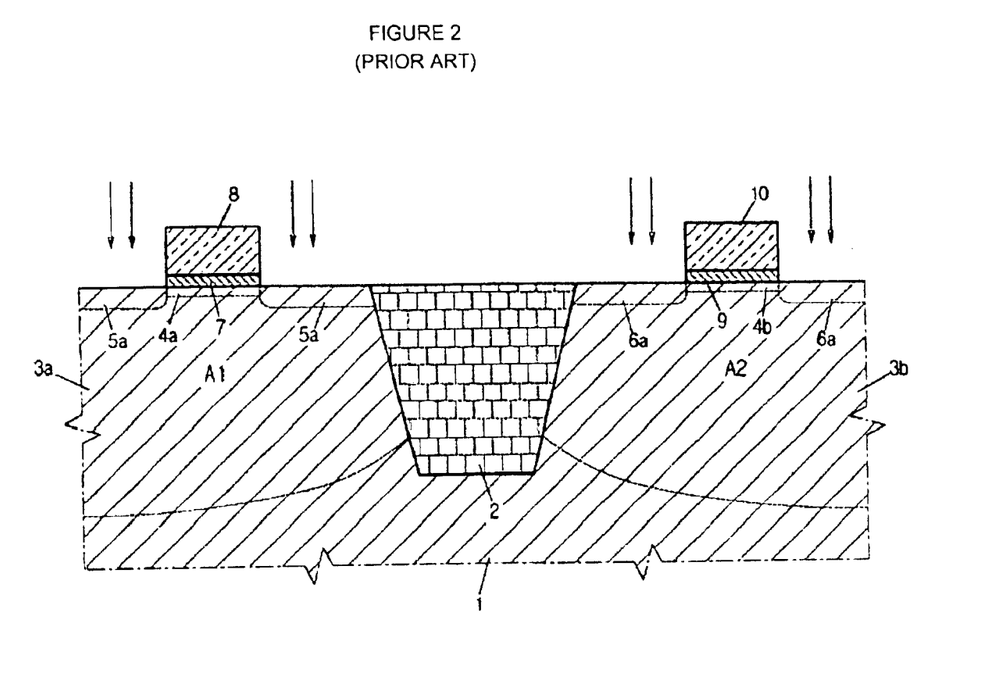
Figure 3:
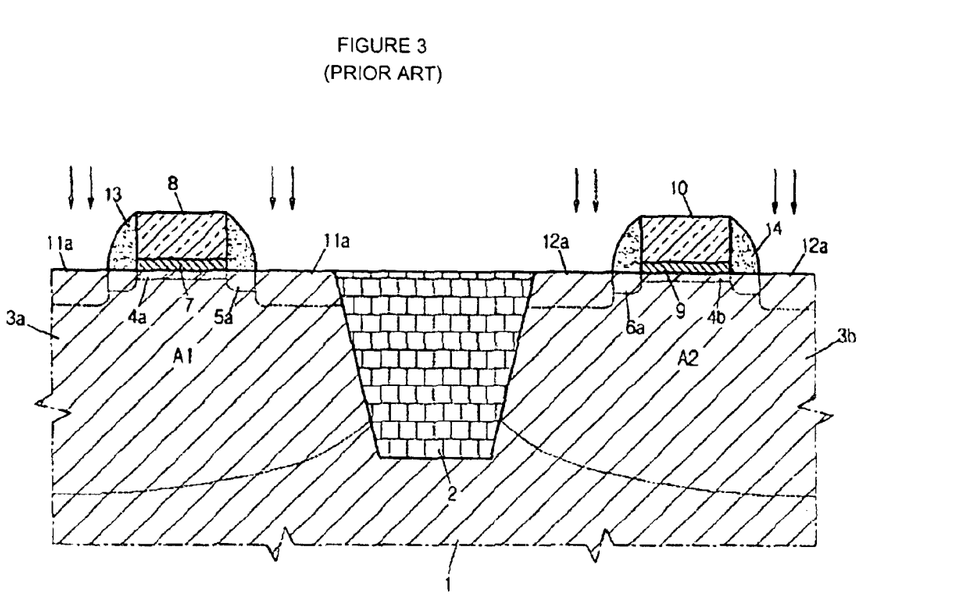
Figure 4:
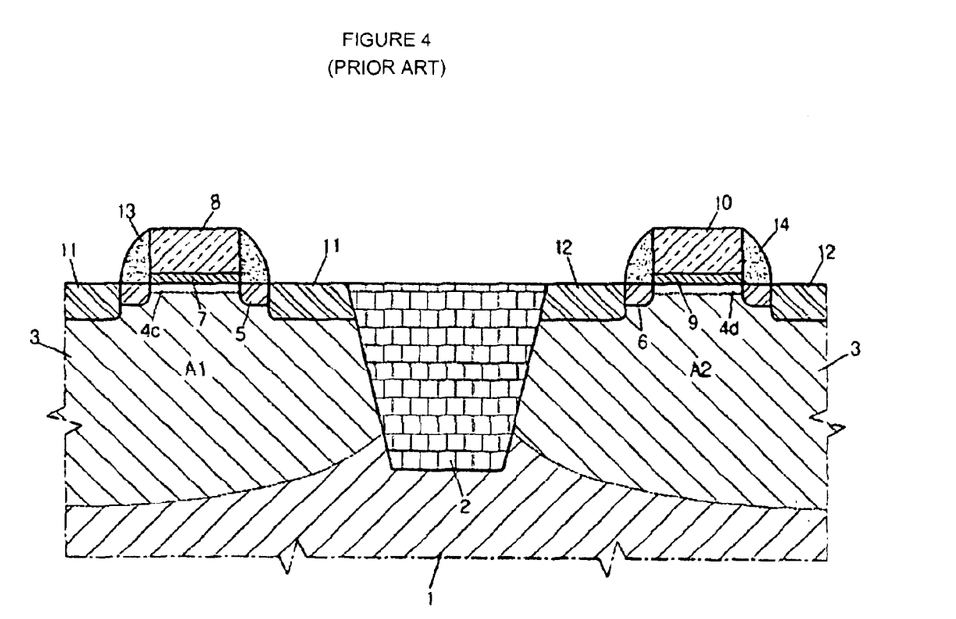

Generally, a semiconductor device in the relevant art, for example, PMOS device/NMOS device is manufactured by the steps of implanting certain impurities into the predetermined well formation regions 3a and 3b and the predetermined channel formation regions 4a and 4b of a P type element region A1 and an N type element region A2 of a semiconductor substrate 1, which are electrically isolated by an element isolating layer 2, as shown in FIG. 1; forming a P-gate insulating layer 7, an N-gate insulating layer 9, a P-poly gate 8, and an N-poly gate 10 on the P type element region A1 and the N type element region A2, and then lightly doping the P/N type impurities such as, for example, BF or P(As), etc. into the predetermined P-LDD and N-LDD regions 5a and 6a of the respective poly-gates 8 and 10 using an ion-implantation process as shown in FIG. 2; forming spacers 13 and 14 on the sidewalls of the respective poly gates 8 and 10, and then by using the spacers 13 and 14 as a mask, heavily doping the P/N type impurities such as, for example, B or P, etc. into the predetermined P and N-source/drain regions 11a and 12a of the respective poly gates 8 and 10 as shown in FIG. 3; and using a high temperature annealing process for the semiconductor substrate 1 having the structures formed by the above procedures, inducing the diffusion of the impurities implanted in the predetermined well formation regions 3a and 3b, the predetermined P and N-channel regions 4a and 4b, the predetermined P and N-LDD regions 5a and 6a, and the predetermined P and N-source/drain regions 11a and 12a, thereby forming a well 3, a P-channel 4c, an N-channel 4d, a P-LDD 5, an N-LDD 6, a P-source/drain region 11, an N-source/drain region 12 and so on in the finished form as shown in FIG. 4.

For example, such PMOS device and NMOS device according to the prior art have been disclosed specifically in, for example, U.S. Pat. No. 4,745,086 entitled "Removal sidewall spacer for lightly doped drain formation using one mask level and differential oxidation", U.S. Pat. No. 5,460,993 entitled "Method of making NMOS and PMOS LDD transistors utilizing thinned sidewall spacers", U.S. Pat. No. 5,254,866 entitled "LDD CMOS with wider oxide sidewall on PMOS than NMOS", U.S. Pat. No. 6,107,130 entitled "CMOS integrated circuit having a sacrificial metal spacer for producing graded NMOS source/drain junctions dissimilar from PMOS source/drain junctions" and so on.

Figure 5:
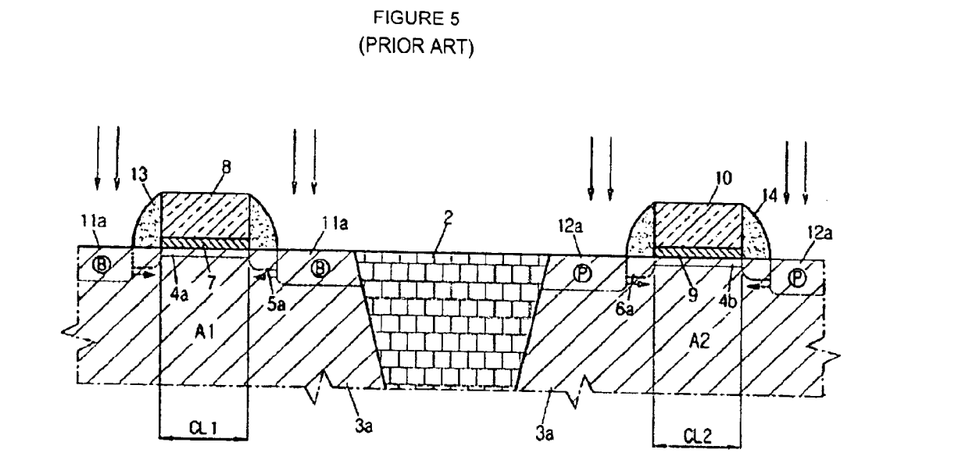
FIG. 5 is a concept view showing a diffusion state of the impurities according to the prior art.

In a system of the related art, in order to form the finished well 3, channels 4c and 4d, LDDs 5 and 6, source/drain 11 and 12 and so on, the annealing process should be performed on the semiconductor substrate 1. As shown in FIG. 5, the P type impurities (such as B) or N type impurities (such as P), etc. implanted into the predetermined P and N-LDD regions 5a and 6a, and the predetermined P and N-source/drain regions 11a and 12a are diffused at a constant velocity by the heat generated during the annealing process.

However, since the P type impurities such as B generally have a diffusion velocity that is greater than that of the N type impurities such as P or As, in the prior art system, the channel length CL1 of a finished PMOS device formed by the diffusion of P type impurities always is shorter than the channel length CL2 of a finished NMOS device formed by the diffusion of N type impurities.

Thus, unless a separate measure is taken in a state where the channel lengths CL1 and CL2 of the PMOS and NMOS devices are different, the PMOS device and NOMS device have no choice but to have different threshold voltages, so that the quality of a finished high integrated semiconductor device would be below a certain level.

SUMMARY OF THE INVENTION

Accordingly, the present invention has been made to solve the above-mentioned problems occurring in the prior art, and an object of the present invention is to provide a method of manufacturing a semiconductor device, in which an oxide layer for regulating the ion-implantation is previously formed before the implantation of the impurities into a predetermined region of a P-lightly doped drain (LDD) to optionally regulate the implantation state of P type impurities implanted into the corresponding predetermined region of P-LDD based on the oxide layer for regulating the ion-implantation, so that the PMOS side predetermined channel length may be elongated longer than the NMOS side predetermined channel length, thus maintaining the finished PMOS and NMOS side channel lengths equal irrespective of diffusion velocity of the impurities even if a substantial annealing process is performed and P type impurities are diffused faster than N type impurities due to their structural difference.

Another object of the present invention is to provide a method of manufacturing a semiconductor device, wherein separate spacers are selected and formed on different scales before the implantation of the impurities into the predetermined regions of a P-lightly doped drain (LDD) and an N-LDD to optionally regulate the implantation state of impurities implanted into the respective predetermined regions of the LDD based on the differently scaled spacers so that, if necessary, the PMOS and NMOS side predetermined channel lengths are selectively regulated, thus, if necessary, effectively regulating the finished PMOS and NMOS side channel lengths irrespective of diffusion velocity of the respective impurities even if a substantial annealing process is performed and P type impurities are diffused faster than N type impurities due to their structural difference.

Further object of the present invention is to provide a method of manufacturing a semiconductor device in which the PMOS/NMOS device channel lengths are maintained equal to induce the identification of threshold voltage of the devices, thereby increasing the quality of a finished high integrated semiconductor device over a certain level.

Still further object of the present invention is to provide a method of manufacturing a semiconductor device in which the PMOS/NMOS device channel lengths are regulated in such a manner that, if necessary, the threshold voltage of the devices are selectively regulated, thereby increasing the quality of a finished high integrated semiconductor device over a certain level.

In order to accomplish these objects, the present invention provides a method of manufacturing a semiconductor device, including: forming a P-poly gate and an N-poly gate on a P type element region and an N element region, respectively, of a semiconductor substrate electrically isolated by an element isolating layer; shielding the P type element region and lightly ion-doping the N type impurities selectively to a predetermined N-LDD region around the N-poly gate; forming an oxide layer for regulating the ion-implantation on the front face of the semiconductor substrate so as to cover the P and N-poly gates; shielding the N type element region and lightly ion-doping the P type impurities selectively to a predetermined P-LDD region around the P-poly gate using the oxide layer for regulating the ion-implantation as a buffer mask; removing the oxide layer for regulating the ion-implantation, forming spacers to the respective P-poly gate and the N-poly gate respectively, and heavily ion-doping the P and N type impurities selectively to a predetermined P-source/drain region and a predetermined N-source/drain region around the P-poly gate and the N-poly gate, respectively, using the relevant spacers as buffer masks; and annealing the semiconductor substrate so as to diffuse the P and N type impurities doped to the predetermined P and N-LDD regions and the predetermined P and N-source/drain regions.

The present invention further provides a method of manufacturing a semiconductor device, including: forming a P-poly gate and an N-poly gate on a P type element region and an N element region, respectively, of a semiconductor substrate electrically isolated by an element isolating layer; forming an oxide layer for a spacer on the front face of the semiconductor substrate so as to cover the P and N-poly gates; shielding the N type element region, patterning the oxide layer for the spacer formed on the P type element region to form a first scale P-spacer on a sidewall of the P-poly gate, and lightly ion-doping the P type impurities selectively to a predetermined P-LDD region around the P-poly gate using the P-spacer as a buffer mask; shielding the P type element region, patterning the oxide layer for the spacer formed on the N type element region to form a second scale N-spacer on a sidewall of the N-poly gate, and lightly ion-doping the N type impurities selectively to a predetermined N-LDD region around the N-poly gate using the N-spacer as a buffer mask; heavily ion-doping the P and N type impurities selectively to a predetermined P-source/drain region and a predetermined N-source/drain region around the P-poly gate and the N-poly gate, respectively; and annealing the semiconductor substrate so as to diffuse the P and N type impurities doped to the predetermined P and N-LDD regions and the predetermined P and N-source/drain regions.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, preferred embodiments of the present invention will be described with reference to the accompanying drawings.

Figure 6:
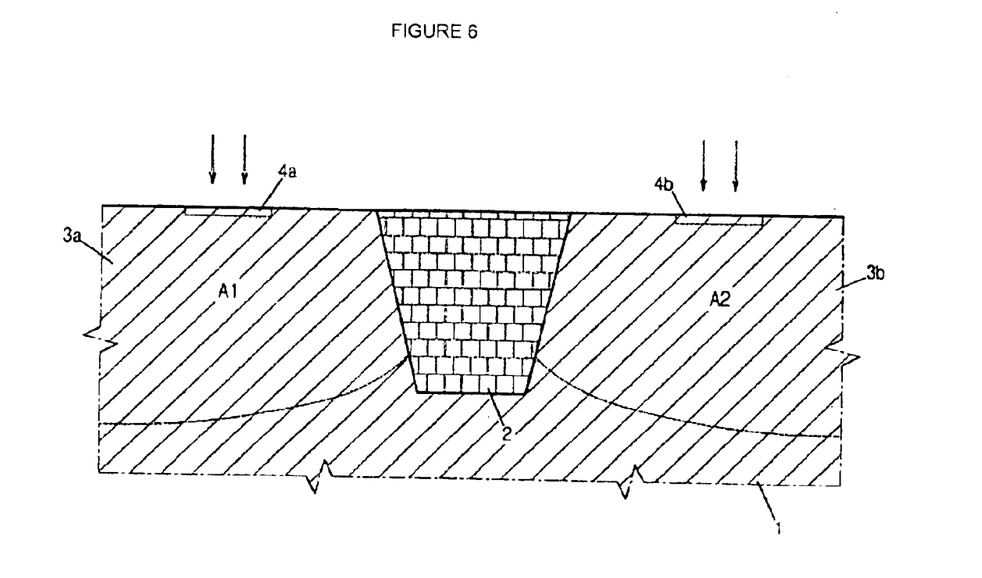
FIGS. 6 to 10 are cross sectional process end views showing a method of manufacturing a semiconductor device according to the present invention.

As shown in FIG. 6, by properly utilizing sacrificial layer patterns, for example, a sacrificial nitride layer pattern, a sacrificial oxide layer pattern and so on, a trench is formed in an element isolating region of a semiconductor substrate 1, and by additionally performing a gap filling process of an insulating layer, a patterning process for the insulating layer and so on, an element isolating layer 2 for filling the inside of the trench is formed. Preferably, the element isolating layer 2 electrically isolates the semiconductor substrate 1 into a P type element region A1 and an N type element region A2.

Then, a photoresist pattern is formed on the P and N type element regions A1 and A2 of the semiconductor substrate 1 alternately, in which the element isolating layer 2 has been formed. Thereafter, by performing an ion-implantation process using the photoresist pattern as a mask, the P/N type impurities such as BF, P (As) and so on are selectively implanted into a predetermined P-channel region 4a and a well region 3a in the P type element region A1 and a predetermined N-channel region 4b and an N-well region 3b in the N type element region A2, etc.

Figure 7:
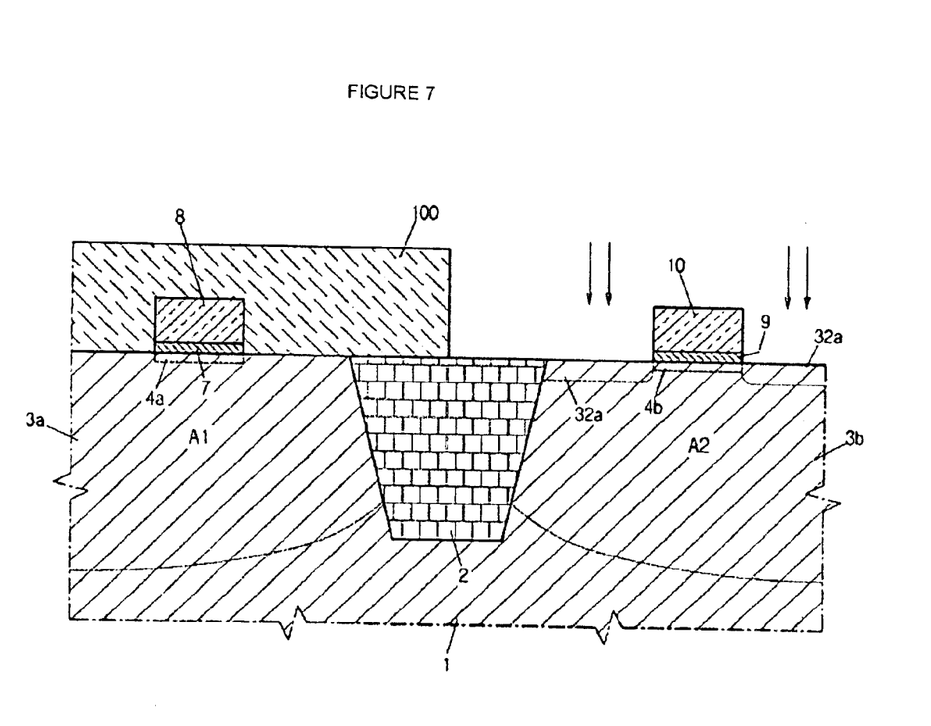

Subsequently, by selectively performing a thermal oxidation process, a low pressure chemical vapor deposition (CVD) process and so on, a gate insulating layer is formed on the semiconductor substrate 1, and by performing the low pressure CVD process, a poly crystal silicon layer is formed on the gate insulating layer. Then, by patterning the gate insulating layer and the poly crystal silicon layer together using a photolithography process, as shown in FIG. 7, a P-gate insulating layer 7, a P-poly gate 8, an N-gate insulating layer 9, and an N-poly gate 10 are formed on the P/N type element regions A1 and A2 of the semiconductor substrate 1.

Then, a photoresist is applied on the semiconductor substrate 1 on which the P and N-poly gates 8 and 10 have been formed, and by exposing and developing the photoresist, a photoresist pattern 100 is formed for exposing the N type element region A2 of the semiconductor substrate (i.e., for shielding the P type element region A1) around the element isolating layer 2.

Thereafter, by performing an ion-implantation using the N type element region A2 as a target, the N type impurities, such as P, As and so on, are lightly ion-doped to a predetermined N-LDD region 32a around the N-poly gate 10.

Figure 8:
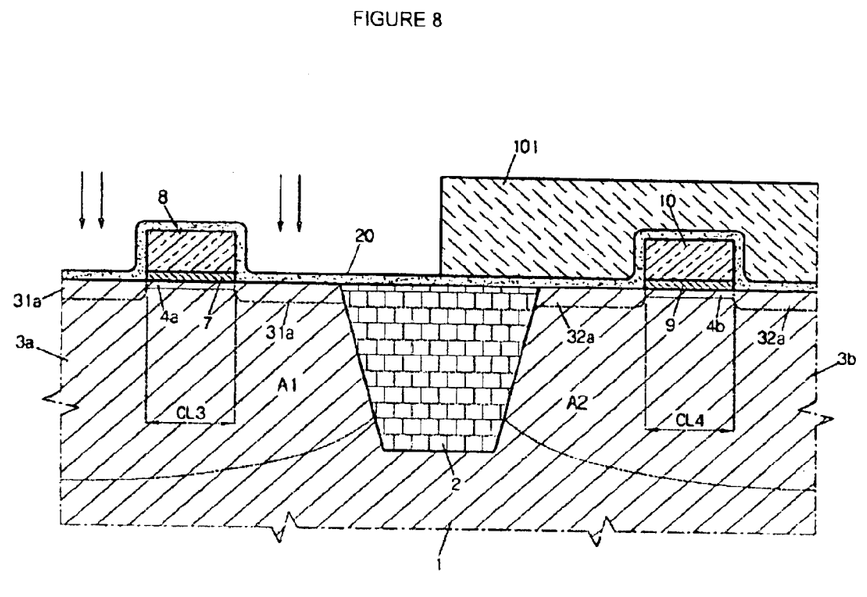

Once the N type impurities are lightly doped to the predetermined N-LDD region 32a completely through the above procedure, the photoresist pattern 100 is removed. Then, by performing a plasma enhanced chemical vapor deposition (PECVD) process at the temperature of, for example, 200~400° C., as shown in FIG. 8, an oxide layer 20 for regulating the ion-implantation, for example, a TEOS film, is formed on the semiconductor substrate 1 so as to cover the P and N-poly gates 8 and 10. Herein, the oxide layer 20 for regulating the ion-implantation is maintained at the thickness of, for example, 100~500 Å.

Then, a photoresist is applied on the semiconductor substrate 1 on which the oxide layer 20 for regulating the ion-implantation has been formed, and by exposing and developing the photoresist, a photoresist pattern 101 is formed for exposing the P type element region A1 (i.e., for shielding the N type element region A2) around the element isolating layer 2.

Thereafter, by performing an ion-implantation process using the P type element region A1 as a target, the P type impurities, such as B and so on, are lightly ion-doped to the predetermined P-LDD region 31a around the P-poly gate 8.

Herein, as described before, since the oxide layer 20 for regulating the ion-implantation has been previously formed on the P type element region A1, the P type impurities implanted into the predetermined P-LDD region 31a around the P-poly gate 8 are necessarily influenced by the oxide layer 20 and thus the implantation doses are reduced. Consequently, the predetermined channel length CL3 of the PMOS side is elongated longer than the predetermined channel length CL4 of the NMOS side.

On the other hand, once the P type impurities are lightly doped to the predetermined P-LDD region 31a completely through the above procedure, the photoresist pattern 101 is removed, and by performing a buffered oxide etching (BOE) process, the oxide layer 20 for regulating the ion-implantation is removed from the front face of the semiconductor substrate 1.

Figure 9:
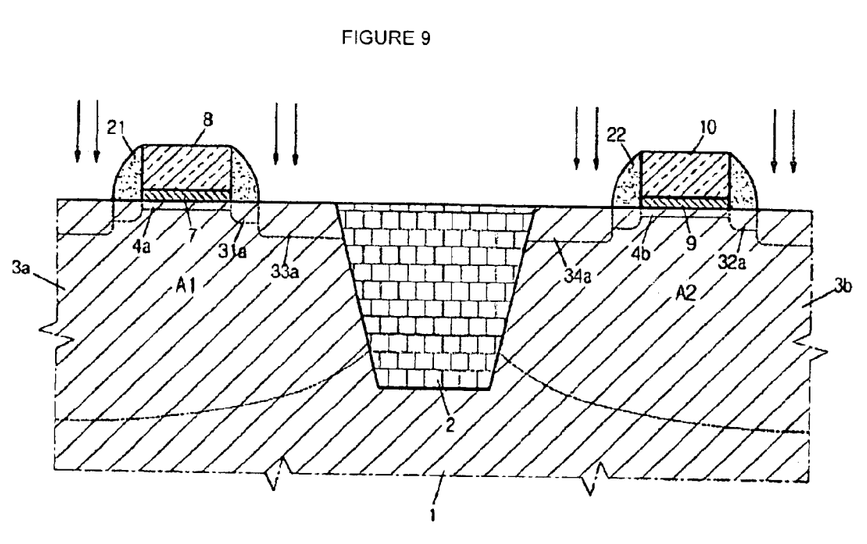

Then, by performing a low pressure CVD process, an insulating layer for spacer is formed on the front face of the semiconductor substrate so as to cover the P and N-poly gates 8 and 10. Thereafter, by performing a dry etching process, for example, a reactive ion etching (RIE) process, which has the anisotropic etching feature, as shown in FIG. 9, the spacers 21 and 22 are formed on the sidewalls of the P and N-poly gates 8 and 10.

Subsequently, by performing an ion-implantation process using the spacers 21 and 22 as buffer masks, the P and N type impurities such as B, P and so on are heavily ion-doped selectively to a predetermined P-source/drain region 33a and a predetermined N-source/drain region 34a around the P-poly gate 8 and the N-poly gate 10.

Once the P and N type impurities such as B, P and so on have been heavily ion-doped to the predetermined P-source/drain region 33a and the predetermined N-source/drain region 34a around the P-poly gate 8 and the N-poly gate 10, respectively, through the above procedure, the semiconductor substrate 1 having the structures formed by the foregoing procedure is moved to, for example, a diffusion furnace. Thereafter, by performing a high temperature annealing process in the diffusion furnace, the impurities, which are implanted into the predetermined well region 3a, predetermined P and N-channel regions 4a and 4b, predetermined P and N-LDD regions 31a and 32a, and predetermined P and N-source/drain regions 33a and 34a, are induced to diffuse.

Figure 10:
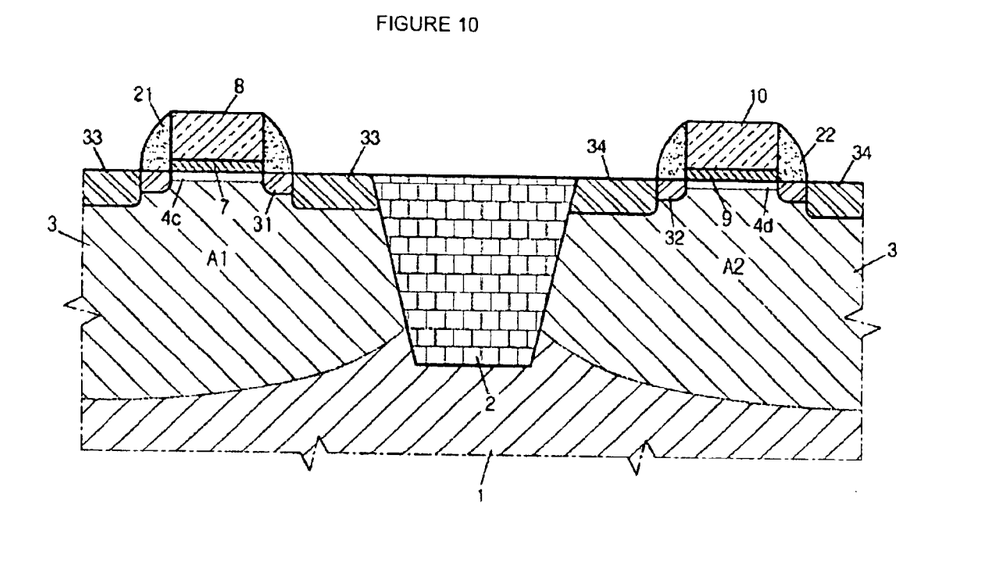

As a result, when the annealing process has been completed, as shown in FIG. 10, a PMOS device and an NMOS device are manufactured to the P and N type element regions A1 and A2, respectively, the PMOS and NMOS devices having the finished well 3, P and N-channels 4c and 4d, P and N-LDDs 31 and 32, and P and N-source/drains 33 and 34.

Figure 11:
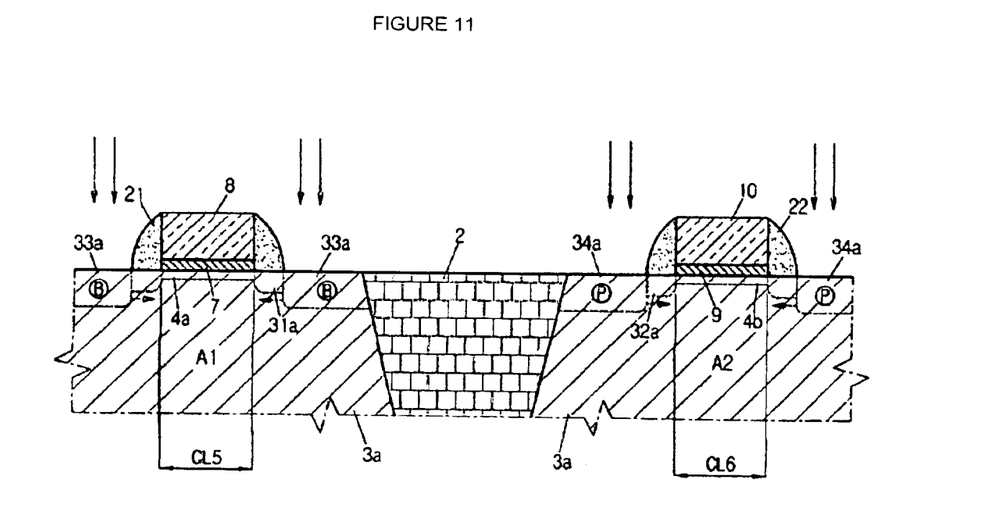
FIG. 11 is a concept view showing a diffusion state of the impurities according to the present invention.

As shown in FIG. 11, the P type impurities (such as B) or N type impurities (such as P), etc. implanted into the predetermined P and N-LDD regions 31a and 32a, and the predetermined P and N-source/drain regions 33a and 34a are diffused at a constant velocity by the heat generated during the annealing process. In this case, the P type impurities such as B have diffusion velocity that is greater than that of the N type impurities such as P or As.

Herein, as described above, since the oxide layer 20 for regulating the ion-implantation is previously formed before the implantation of the impurities into the predetermined P-LDD region 31a to optionally regulate the implantation state of P type impurities that are implanted into the corresponding predetermined P-LDD region 31a based on the oxide layer 20 for regulating the ion-implantation, the PMOS side predetermined channel length CL3 may be elongated longer than the NMOS side predetermined channel length CL4. Thus, the finished PMOS and NMOS side channel lengths CL5 and CL6 are naturally maintained equal irrespective of diffusion velocity of the impurities even if the annealing process is performed and the P type impurities are diffused faster than the N type impurities.

If the PMOS and NMOS side channel lengths CL5 and CL6 are maintained equal irrespective of diffusion velocity of the respective impurities, the finished PMOS device and NMOS device may naturally have the same threshold voltage, maintaining the quality of a high integrated semiconductor device over a certain level.

Then, by performing a silicide process, a silicide layer composed of SiTiX, SiCOX and so on is formed on the surface of the P and N-poly gates 8 and 10 and the P and N-source/drains 33 and 34 and, thereafter, by performing a conventional post-treatment quickly, a semiconductor device is stably manufactured.

A method of manufacturing a semiconductor device according to another preferred embodiment of the present invention will be described with reference to FIGS. 12 to 18.

Figure 12:
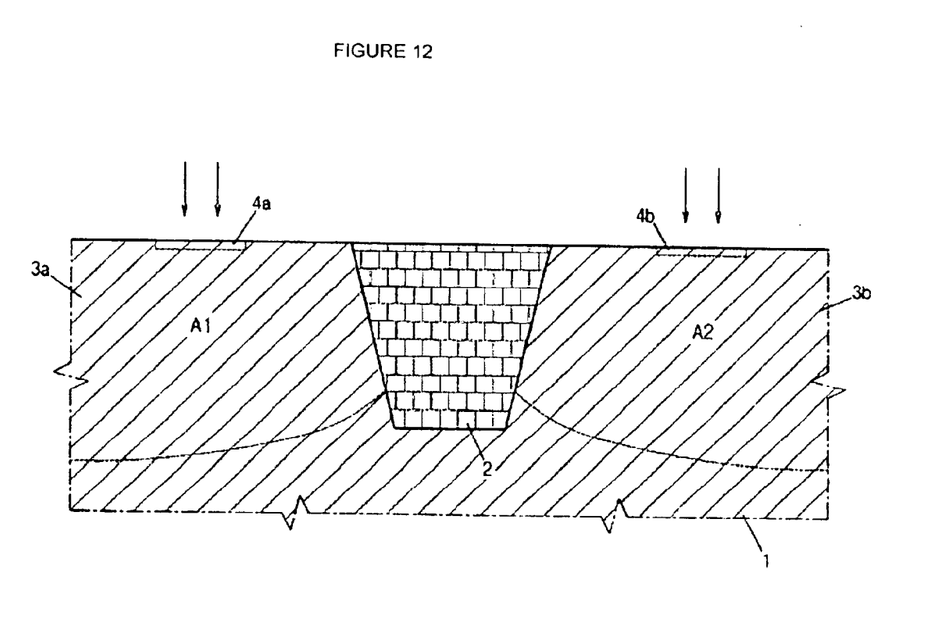
FIGS. 12 to 17 are cross sectional process end views showing a method of manufacturing a semiconductor device according to another preferred embodiment of the present invention.

First, as shown in FIG. 12, by properly utilizing a sacrificial layer pattern, for example, a sacrificial nitride layer pattern, a sacrificial oxide layer pattern and so on, a trench is formed in an element isolating region of a semiconductor substrate 1, and by additionally performing an insulating layer gap filling process, an insulating layer patterning process and so on, an element isolating layer 2 is formed for filling the inside of the trench. Preferably, the element isolating layer 2 electrically isolates a P type element region A1 and an N type element region A2 of the semiconductor substrate 1.

Then, a photoresist pattern is formed alternately on the P and N type element regions A1 and A2 of the semiconductor substrate 1 in which the element isolating layer 2 has been formed, and by performing an ion-implantation process using the photoresist pattern as a mask, the P/N type impurities such as BF, P (As) and so on are selectively implanted into a predetermined P-channel region 4a and a well region 3a in the P type element region A1 and a predetermined N-channel region 4b and an N-well region 3b in the N type element region A2, etc.

Subsequently, by selectively performing a thermal oxidation process, a low pressure chemical vapor deposition (CVD) process and so on, a gate insulating layer is formed on the semiconductor substrate 1, and by performing the low pressure CVD process, a poly crystal silicon layer is formed on the gate insulating layer. Then, by patterning the gate insulating layer and the poly crystal silicon layer together using a photolithography process, as shown in FIG. 7, a P-gate insulating layer 7, a P-poly gate 8, an N-gate insulating layer 9, and an N-poly gate 10 are formed on the P/N type element regions A1 and A2 of the semiconductor substrate 1.

Figure 13:
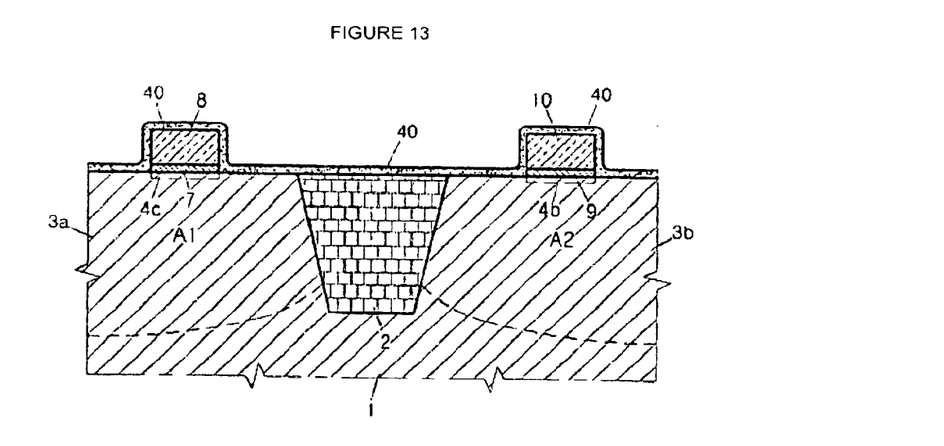

Once the P-gate insulating layer 7, the P-poly gate 8, the N-gate insulating layer 9, and the N-poly gate 10 have been formed on the P/N type element regions A1 and A2 of the semiconductor substrate 1 through the above procedure, by performing a CVD process at the temperature of, for example, 0~900° C., as shown in the drawings, an oxide layer 40 for the spacer is formed on the semiconductor substrate 1 so as to cover the P and N-poly gates 8 and 10. Preferably, the oxide layer 40 for the spacer maintains the thickness of, for example, 100~500 Å.

Figure 14:
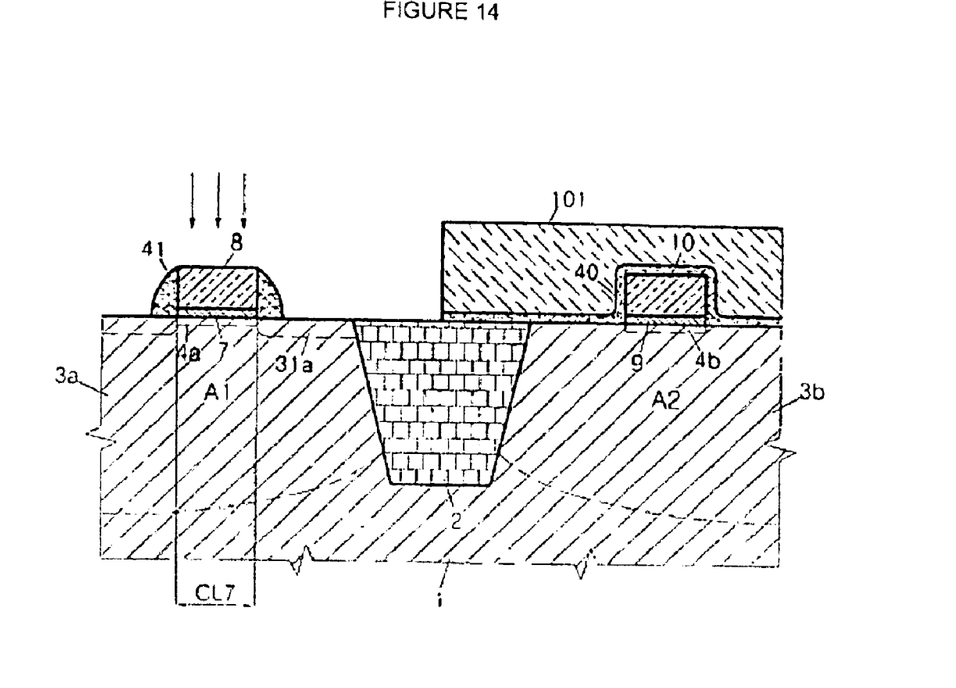

Then, a photoresist is applied on the semiconductor substrate 1 on which the oxide layer 40 for spacer has been formed, and by exposing and developing the photoresist, as shown in FIG. 14, a photoresist pattern 101 is formed for exposing the P type element region A1 of the semiconductor substrate 1 (i.e., for shielding the N type element region A2) around the element isolating layer 2.

At this stage, by performing a dry etching process, for example, a RIE process, that has an anisotropic etching feature, a part of the oxide layer 40 for the spacer is etched to form a spacer 41 on a sidewall of the P-poly gate 8 as shown in the drawing. Herein, the etching rate of the spacer 41 is properly regulated so that the corresponding spacer 41 is formed on a scale suitable to secure a desired predetermined channel length CL7 of the PMOS side.

Thereafter, by performing an ion-implantation process using the P type element region A1 as a target, the P type impurities, such as B and so on, are lightly ion-doped to a predetermined P-LDD region 31a around the P-poly gate 8.

Herein, as described above, since the spacer 41 whose scale was adjusted flexibly, has been previously formed on the predetermined P-LDD region 31a, the P type impurities implanted into the predetermined P-LDD region 31a around the P-poly gate 8 are necessarily influenced by the spacer 41 and may be properly regulated in their implantation doses. Consequently, the predetermined channel length CL7 of the PMOS side can be easily regulated to have a desired value.

Figure 15:
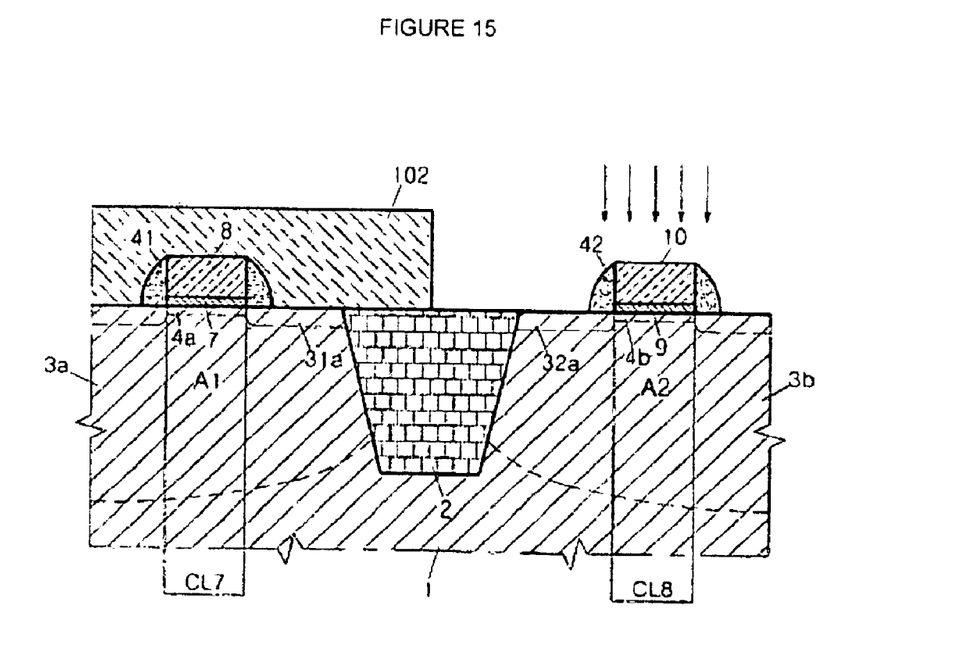

Once the P type impurities have been lightly doped to the predetermined P-LDD region 31a completely through the above procedure, the photoresist pattern 101 is removed, a photoresist is applied on the semiconductor substrate 1 on which a part of the oxide layer 40 has been formed, and the photoresist is exposed and developed, forming a photoresist pattern 102 for exposing the N type element region A2 of the semiconductor substrate 1 (i.e., for shielding the P type element region A1) around the element isolating layer 2 as shown in FIG. 15.

At this stage, by performing a dry etching process, for example, a RIE process, that has an anisotropic etching feature, a part of the oxide layer 40 for the spacer is etched to form a spacer 42 on a sidewall of the N-poly gate 10 as shown in the drawing. Herein, the etching rate of the spacer 42 is properly regulated so that the corresponding spacer 42 is formed on a scale suitable to secure a desired predetermined channel length CL8 of the NMOS side.

Then, by performing an ion-implantation using the N type element region A2 as a target, the N type impurities, such as P, As and so on, are lightly ion-doped to the predetermined N-LDD region 32a around the N-poly gate 10.

Herein, as described above, since the spacer 42 whose scale was adjusted flexibly according to the necessity has been previously formed on the predetermined N-LDD region 32a, the N type impurities implanted into the predetermined N-LDD region 32a around the N-poly gate 10 are necessarily influenced by the spacer 42 and thus may be properly regulated in their implantation doses. Consequently, the predetermined channel length CL8 of the NMOS side can be easily regulated to have a desired value.

Figure 16:
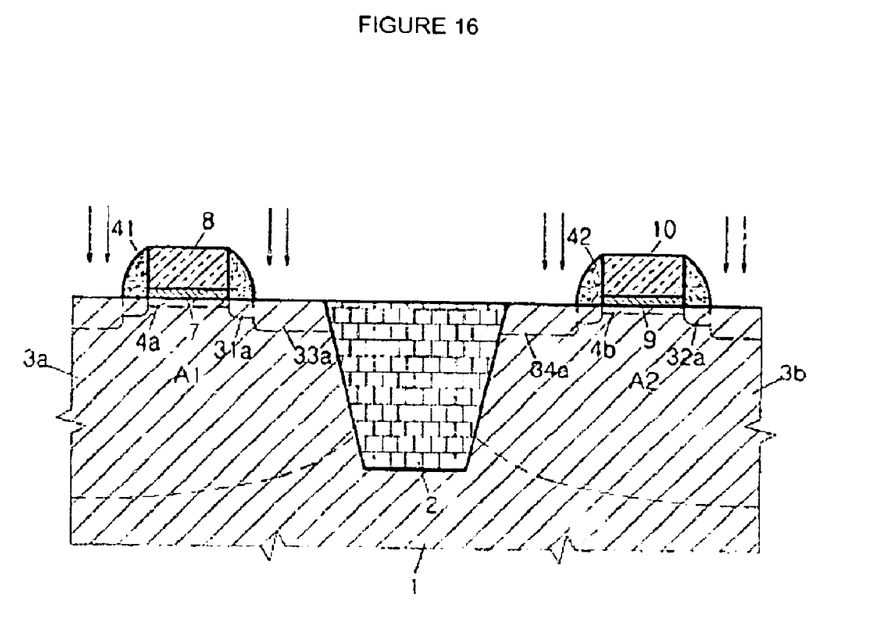

On the other hand, once the N type impurities have been lightly ion-doped to the predetermined N-LDD region 32a through the above procedure, as shown in FIG. 16, by performing an ion-implantation process using the spacers 41 and 42 as buffer masks after the photoresist pattern 102 is removed, the P and N type impurities such as B, P and so on are heavily ion-doped selectively to a predetermined P-source/drain region 33a and a predetermined N-source/drain region 34a around the P-poly gate 8 and the N-poly gate 10, respectively.

When the P and N type impurities have been heavily ion-doped to the predetermined P-source/drain region 33a and the predetermined N-source/drain region 34a around the P-poly gate 8 and the N-poly gate 10, respectively, through the above procedure, the semiconductor substrate 1 having structures formed by the foregoing procedure is moved to, for example, a diffusion furnace, and by performing a high temperature annealing process in the diffusion furnace, the impurities, which have been implanted into the predetermined well region 3a, predetermined P and N-channel regions 4a and 4b, predetermined P and N-LDD regions 31a and 32a, and predetermined P and N-source/drain regions 33a and 34a, are induced to diffuse.

Figure 17:
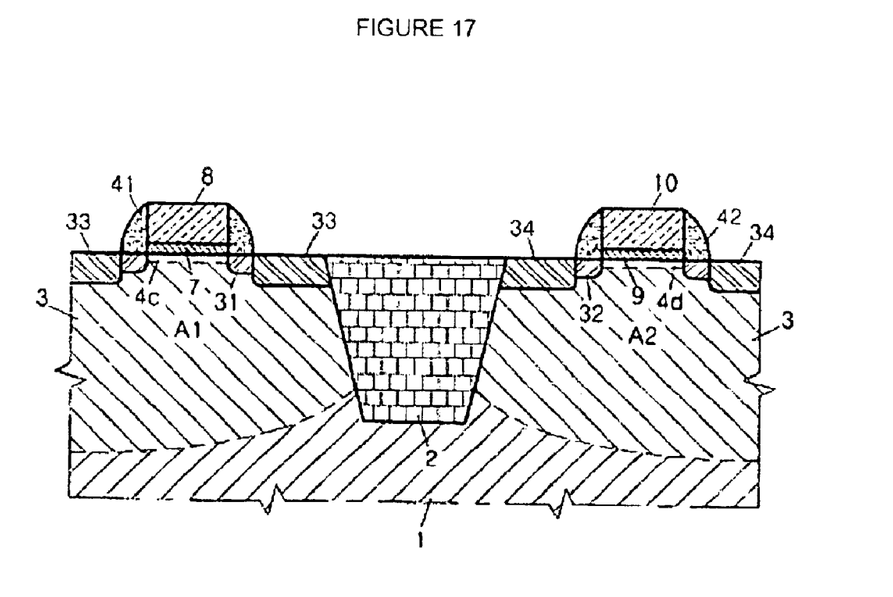

As a result, when the annealing process has been completed, as shown in FIG. 17, a PMOS device and an NMOS device are manufactured to the P and N type element regions A1 and A2, respectively, the PMOS and NMOS devices having the finished well 3, P and N-channels 4c and 4d, P and N-LDDs 31 and 32, and P and N-source/drains 33 and 34.

Figure 18:
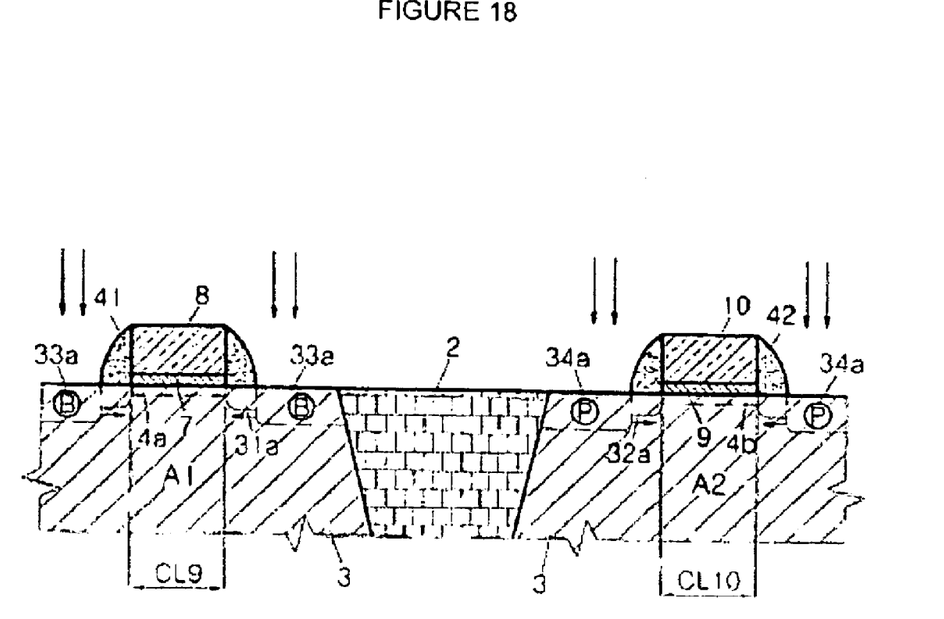
FIG. 18 is a concept view showing a diffusion state of the impurities according to another preferred embodiment of the present invention.

As shown in FIG. 18, the P type impurities (such as B) or N type impurities (such as P), etc. implanted into the predetermined P and N-LDD region 31a and 32a, and the predetermined P and N-source/drain region 33a and 34a are diffused at a constant velocity by the heat generated during the annealing process. In this case, as described above, the P type impurities such as B have a diffusion velocity that is greater than that of the N type impurities such as P or As.

At this time, as described above, the separate spacers 41 and 42 have been previously selected and formed on a scale different to each other before the implantation of the impurities into the predetermined P and N-LDD region 31a and 32a to optionally regulate the implantation state of the impurities implanted into the corresponding predetermined LDD region 31a and 32a based on the different scaled spacers 41 and 42, if necessary, selectively regulating the predetermined channel lengths CL7 and CL8 of the PMOS and the NMOS sides. Thus, the finished PMOS side channel length CL9 and the finished NMOS side channel length CL10 may be effectively and selectively regulated, if necessary, irrespective of diffusion velocity of the impurities even if the annealing process is performed and the P type impurities are diffused faster than the N type impurities.

When the PMOS and NMOS side channel lengths CL9 and CL10 are maintained to have effective values irrespective of diffusion velocity of the respective impurities, a finished PMOS device and an NMOS device will naturally have desired threshold voltage, resultantly, easily maintaining the quality of a high integrated semiconductor device over a certain level.

Then, by performing a silicide process, a silicide layer composed of SiTiX, SiCOX and so on is formed on the surface of the P and N-poly gates 8 and 10 and the P and N-source/drains 33 and 34, and successively by performing a conventional post-treatment quickly, a semiconductor device is stably manufactured.

As described above, the present invention provides a method of manufacturing a semiconductor device, in which an oxide layer for regulating the ion-implantation is previously formed before the implantation of the impurities into a predetermined region of a P-lightly doped drain (LDD) to optionally regulate the implantation state of P type impurities implanted into the corresponding predetermined region of P-LDD based on the oxide layer for regulating the ion-implantation. Accordingly, the PMOS side predetermined channel length is guided to be elongated longer than the NMOS side predetermined channel length, thus maintaining the finished PMOS and NMOS side channel lengths equal irrespective of diffusion velocity of the impurities even if a substantial annealing process is performed and P type impurities are diffused faster than N type impurities due to their structural difference.

When the PMOS and NMOS side channel lengths are maintained equal irrespective of diffusion velocity of the respective impurities, a finished PMOS device and an NMOS device will be able to have the same threshold voltage, maintaining the quality of a high integrated semiconductor device over a certain level.

The present invention further provides a method of manufacturing a semiconductor device, wherein separate spacers are selected and formed on different scales before the implantation of the impurities into the predetermined regions of a P-lightly doped drain (LDD) and an N-LDD to optionally regulate the implantation state of impurities implanted into the respective predetermined regions of the LDD based on the differently scaled spacers. Thus, if necessary, the PMOS and NMOS side predetermined channel lengths are selectively regulated. Accordingly, the finished PMOS and NMOS side channel lengths may be regulated effectively, as necessary, irrespective of diffusion velocity of the respective impurities even if a substantial annealing process is performed and type impurities are diffused faster than N type impurities due to their structural difference.

If the PMOS and NMOS side channel lengths are maintained to have desired values irrespective of diffusion velocity of the respective impurities, a finished PMOS device and an NMOS device may be able to have desired threshold voltage, thus easily maintaining the quality of a high integrated semiconductor device over a certain level.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method of manufacturing a semiconductor device, comprising:

forming a P-poly gate and an N-poly gate on a P type element region and an N element region, respectively, of a semiconductor substrate electrically isolated by an element isolating layer;

shielding the P type element region and lightly ion-doping the N type impurities selectively to a predetermined N-LDD region around the N-poly gate;

forming an oxide layer for regulating the ion-implantation on the front face of the semiconductor substrate so as to cover the P-poly gate and the N-poly gate;

shielding the N type element region and lightly ion-doping the P type impurities selectively to a predetermined P-LDD region around the P-poly gate using the oxide layer for regulating the ion-implantation as a buffer mask;

removing the oxide layer for regulating the ion-implantation, forming spacers to the respective P-poly gate and the N-poly gate, and heavily ion-doping the P type and N type impurities selectively to a predetermined P-source/drain region and a predetermined N-source/drain region around the P-poly gate and the N-poly gate, respectively, using the respective spacers as buffer masks; and annealing the semiconductor substrate so as to diffuse the P type and N type impurities doped to the predetermined P-LDD and N-LDD regions and the predetermined P-source/drain and N-source/drain regions.

2. The method of claim 1, wherein the oxide layer for regulating the ion-implantation is formed by a PECVD process at the temperature of 200~400° C.

3. The method of claim 1, wherein the oxide layer for regulating the ion-implantation is a Tetra Ethyl Ortho Silicate (TEOS) film.

4. The method of claim 1, wherein the oxide layer for regulating the ion-implantation has the thickness of 100~500 Å.

5. A method of manufacturing a semiconductor device, comprising:

forming a P-poly gate and an N-poly gate on a P type element region and an N element region, respectively, of a semiconductor substrate electrically isolated by an element isolating layer;

forming an oxide layer for a spacer on the front face of the semiconductor substrate so as to cover the P-poly gate and the N-poly gate;

shielding the N type element region, patterning the oxide layer for the spacer formed on the P type element region to form a first scale P-spacer on a sidewall of the P-poly gate, and lightly ion-doping the P type impurities selectively to a predetermined P-LDD region around the P-poly gate using the P-spacer as a buffer mask;

shielding the P type element region, patterning the oxide layer for the spacer formed on the N type element region to form a second scale N-spacer on a sidewall of the N-poly gate, and lightly ion-doping the N type impurities selectively to a predetermined N-LDD region around the N-poly gate using the N-spacer as a buffer mask;

heavily ion-doping the P type and N type impurities selectively to a predetermined P-source/drain region and a predetermined N-source/drain region around the P-poly gate and the N-poly gate, respectively; and annealing the semiconductor substrate so as to diffuse the P type and N type impurities doped to the predetermined P-LDD and N-LDD regions and the predetermined P-source/drain and N-source/drain regions.

6. The method of claim 5, wherein the oxide layer for spacer is formed at the temperature of 700~900° C.

7. The method of claim 5, wherein the oxide layer for spacer has the thickness of 100~500 Å.

* * * * *